United States Patent [19]

Dobran

[11] Patent Number: 5,135,047

[45] Date of Patent: Aug. 4, 1992

[54] FURNACE FOR HIGH QUALITY AND SUPERCONDUCTING BULK CRYSTAL GROWTHS

[75] Inventor: Flavio Dobran, 21 St. Broadway, Long Island City, N.Y. 11106

[73] Assignee: Flavio Dobran, Long Island City, N.Y.

[21] Appl. No.: 417,326

[22] Filed: Oct. 5, 1989

[51] Int. Cl.$^5$ .............. C30B 29/06; C30B 35/00; B22D 27/04; F28D 15/02

[52] U.S. Cl. .................. 165/48.1; 165/61; 165/70; 156/616.4; 156/616.41; 422/248; 373/113; 373/158

[58] Field of Search .............. 165/61, 64, 48.1, 70; 422/248; 156/616.4, 616.41; 373/113, 158, 154, 165

[56] References Cited

U.S. PATENT DOCUMENTS

| | | | |
|---|---|---|---|
| 2,903,495 | 9/1959 | Dickson et al. | 165/70 |
| 3,770,047 | 11/1973 | Kirkpatrick et al. | 165/47 |
| 3,857,990 | 12/1974 | Steininger et al. | 165/104.26 |
| 4,312,700 | 1/1982 | Helmreich et al. | 422/248 |
| 4,980,133 | 12/1990 | Koch | 156/616.4 |

FOREIGN PATENT DOCUMENTS 2213403 8/1989 United Kingdom ............ 156/616.4

Primary Examiner—Albert W. Davis, Jr.

[57] ABSTRACT

The manufacturing of high temperature superconducting crystals and high quality crystals in general requires a furnace design with very precise process control to minimize the crystal defects. A furnace design of this type can be realized by growing crystals in the cavity of the evaporator section of a specially designed heat pipe, since the temperature of the working fluid in the heat pipe, and thus in the cavity and crystal, can be maintained very accurately by the control of the evaporating pressure of the heat pipe's working fluid. The crystals are grown from the melt from the bottom of a cooled and rotating crucible which is placed into the heat pipe evaporator cavity. The growth of high temperature superconducting crystals requires high furnace temperatures and an oxygen atmosphere. The high temperature furnace condition is achieved with sodium and potasium heat pipes. A double wall construction between the heat pipe and crystal growing region allows for the maintenance of a vacuum condition between these regions to prevent convective motions and potential safety problems associated with furnace malfunction. The heat pipe condenser and radiation heat sink zone of the evaporator cavity are cooled with fluids circulating through the cooling jackets of the furnace. When the furnace is equipped with a heat pipe working fluid pressure sensor, evaporator cavity and crucible base temperature sensors, and heater and cooling fluid controllers, the temperature control of the crystal growing environment can be maintained within $+-0.1°$ C., for furnace operating temperatures up to 1000° C.

2 Claims, 2 Drawing Sheets

FURNACE FOR HIGH QUALITY AND SUPERCONDUCTING BULK CRYSTAL GROWTHS

CROSS-REFERENCE TO RELATED APPLICATIONS

1. M. E. Kirkpatrick, T. S. Piwonka, B. D. Marcus, Apparatus for unidirectionally solidifying metals. U.S. Pat. No. 3,770,047, November/1973.
2. J. Steininger, T. B. Reed, Heat pipe furnace. U.S. Pat. No. 3,857,990, December/1974.

BACKGROUND OF THE INVENTION

1. Field of the Invention

The invention relates to the art of crystal growing under controlled temperature conditions for the purpose of producing crystals with minimum number of defects.

2. Background Art

The discovery of high temperature superconductors above the liquid nitrogen temperature of 77° K. paves the way for numerous practical applications. The $Y_1Ba_2Cu_3O_7$(123) and $Bi_2Ca_2Sr_2Cu_3O_{10}$ (Bi2223) superconductors with critical temperatures of 90° and 110° K., respectively, are only two of an entire family of ceramics yielding a high temperature superconductivity. Since the discovery of of the first high temperature superconductor in 1987 above 77° K., superconducting polycrystalline pellets, oriented films, and small size bulk crystals have been produced in laboratories. The films and bulk crystals have oriented structures allowing for greater critical currents and magnetic fields than the polycristalline superconducting materials.

The $Y_1Ba_2Cu_3O_7$ is typical of the superconducting perovskites and the inherent difficulties in manufacturing it are closely related to other members of the family. As such, the crystal manufacturing methods to be developed for this superconductor should be readily extendable to other high temperature superconductors. The bulk material processing problems of these superconductors are associated with incongruent melting, melt nonstoichiometry, crystal growth anisotropy, and the control of the processing environment such as oxygen pressure and crucible type. Because of incongruent melting and anisotropy of grown crystals, the most effective crystal processing methods appear to be growth from the melt and a solution. The crystal growth of 123 and Bi2223 compounds from the melt involve growth from a CuO rich flux in $ZrO_2$ and $ThO_2$ crucibles by a slow cooling process where the flux is used to reduce the melting point temperature. The critical crystal growth conditions consist of the melt composition, temperature distribution and cooling rate in the vicinity of the melt/crystal interface, temperature distribution in the crystal, and crystal annealing time and thermal cycling in an oxygen atmosphere. To achieve progressive crystallization of the melt in the vicinity of the crystal/melt interface it is necessary to remove the liberated latent heat and segregated solute from the interface. These processes occur by the heat diffusion in the crystal and by multicomponent mass diffusion and convection in the melt and solution, with additional complications produced by the crystal growing apparatus and radiation heat transport process. The growth of superconducting crystals requires, therefore, a cooling of the crystal to remove the latent heat and removal of the rejected solute from the interface region into the bulk of the melt or solution. The techniques of single crystal growth should, therefore, make provisions for removal of latent heat from the growing crystal and allow for some type of convective mixing in the melt or solution.

The production of high quality superconducting crystals thus requires the minimization of apparatus vibrations and thermal oscillations in the melt or solution and in the crystal. Thermal oscillations and constitutional supercooling in the melt can produce defects leading to low critical currents and magnetic field, or low quality crystals. Moreover, the induced stresses in the crystal can produce crack nucleation and deleterious effects on crystal properties. For these reasons, the superconducting crystal growing apparatus should be designed with the following characteristics: (1) minimization or absence of vibrations, (2) with a control of thermal fluctuations or temperature in the melt and crystal of better than 1° C. from 600°–1000° C., and (3) minimization of induced thermal stresses. To minimize the crack nucleation in the neck of grown crystals and provide a constant diameter shape, the crystal can be grown by simply placing the material to be solidified in a cylindrical container and growing from a seed crystal at the bottom, with the bottom of the container or crucible maintained below the melting temperature. The elimination of vibrations can be achieved by a furnace design involving no moving parts, and the heat zone should be designed such as to impose on the solid and melt a thermal field whose isotherms are parallel with the bottom of the crucible and have an upward gradient.

BRIEF DESCRIPTION OF APPARATUS

A vertical solidification temperature gradient furnace for manufacturing of high temperature bulk superconductors and high quality crystals in general utilizes the evaporator cavity of a heat pipe in an oxygen environment. The crystals are grown from the melt in a crucible which rests on a crucible base that is cooled to remove the latent heat of solidification. The working fluid in the heat pipe is heated with heating coils, and the heat pipe condenser and evaporator cavity radiation heat sink zone are cooled with fluids circulating through the cooling jackets of the furnace. By appropriately cooling the heat pipe condenser, radiation heat sink zone of the evaporator cavity, and the crucible base it is possible to establish various temperature gradients within the heat pipe cavity and maintain high temperature stability during the crystal growing process.

The high temperature insulation surrounding the heat pipe serves to minimize the heat losses from the furnace. The double wall construction between the heat pipe and crystal growing region allows for the maintenance of a vacuum condition between these regions. This eliminates the undesirable convective motions and provides for a great deal of safety during the furnace operation. This safety is required to minimize the potential problems associated with mixing of oxygen from the crystal growing region and sodium or potassium working fluids in the heat pipe and possibly with the cooling water when used as a coolant to cool the furnace during the manufacturing of high temperature bulk superconductors. The furnace wall is constructed from inconel and integrally welded in several places to eliminate leaks. The crucible base is designed to provide near-horizontal temperature gradients in the melt and it is cooled through the integrally built cooling passages.

The furnace is also equipped with vacuum lines and a vacuum pump to maintain vacuum between the heat pipe and crystal growing region. An oxygen reservoir and pressure regulating valve are employed to establish different oxygen pressure levels in the crystal growing environment, as may be required to grow different types of superconducting crystals. The temperature and temperature gradient control within ±0.1° C. in the crystal growing region of the furnace can be maintained by sensing the pressure of the working fluid within the heat pipe, temperatures of the evaporator cavity wall, temperature of the crucible base, and controlling the heater power to heating coils and cooling fluid flow.

DESCRIPTION OF THE PREFERRED EMBODIMENT

Figure 1:
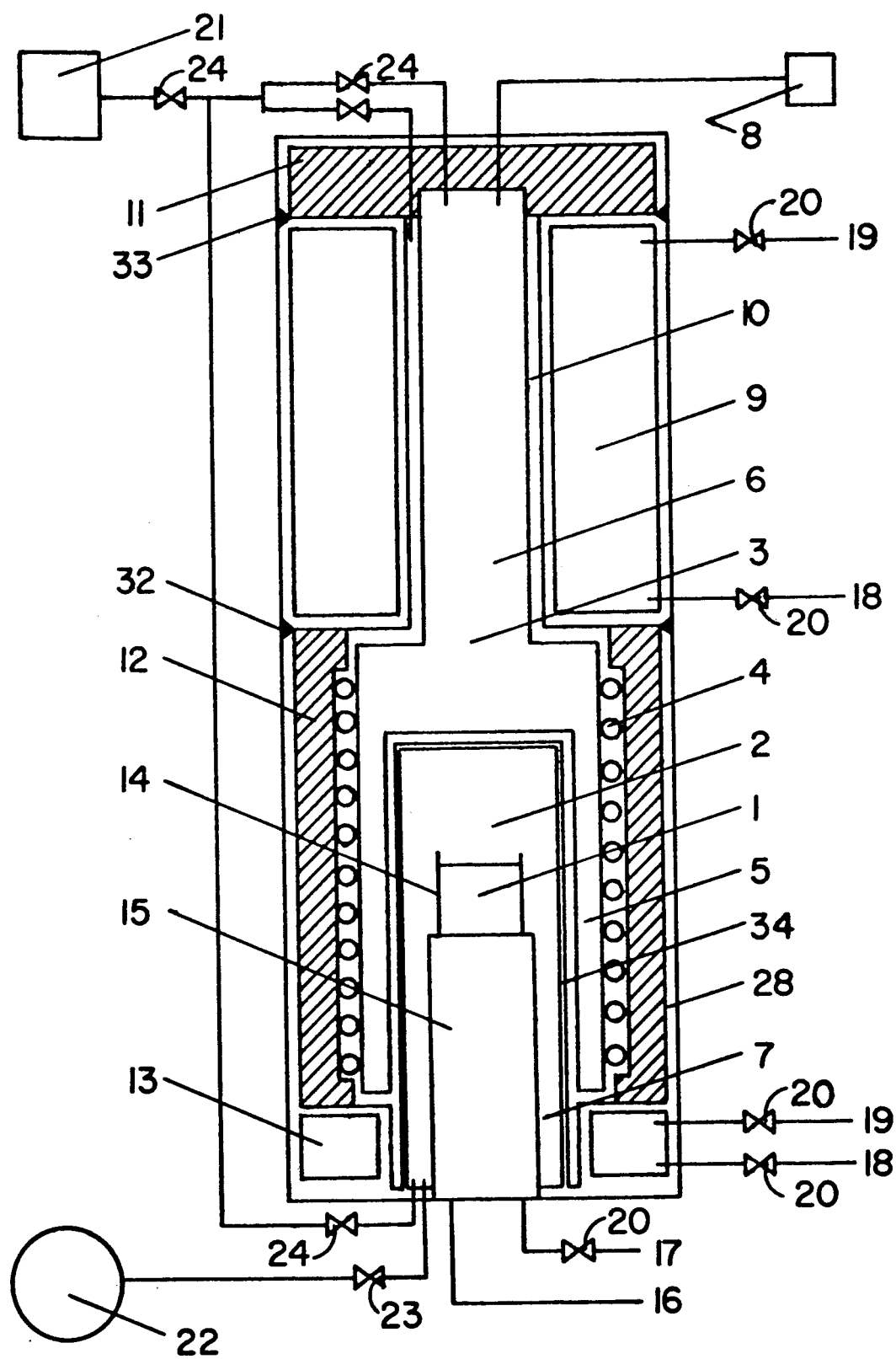
FIG. 1 is a cross-section view through the axis of a furnace having a specially constructed heat pipe with crystals growing in the cavity region of the heat pipe evaporator section.

To obtain high quality crystal growth, the thermal field must be propagated through the furnace in a desired fashion and rate at a high accuracy. Such a vertical solidification thermal gradient apparatus can be constructed with a temperature control of better than ±0.1° C. and is shown in a cross-sectional view in FIG. 1. The crystal growth 1 in this furnace is accomplished in an oxygen atmosphere 2 that is situated in the cavity region of the evaporator 5 of a high temperature specially constructed heat pipe 3. To achieve the required crystal growth temperatures from 600°-1000° C., sodium can be used as the working fluid in the heat pipe and can be evaporated with electrical resistance heating coils 4 placed on the outer surface of the evaporator 5. The furnace cavity for bulk superconductor growth is situated within the evaporator section 5 of the heat pipe whose opening below provides for the radiant energy escape and temperature decrease along the cavity. By properly shaping and temperature calibrating the cavity, providing the heat pipe with the condenser region 6, and cooling the radiation heat sink zone 7, it is possible to establish the required temperature gradients in the furnace or growing crystal 1. Moreover, by sensing the vapor pressure in the heat pipe with a pressure transducer 8 it is possible to control the heat pipe operating temperature and furnace to within ±0.1° C., since the pressure can be monitored very accurately whereas the high temperature cannot.

The heat pipe condenser 6 is radiatively cooled by the cooling jacket 9, and a vacuum is maintained between the heat pipe 3, cooling jackets 9 and 13, and oxygen atmosphere 2. Thus, there is a double wall protection between the sodium and oxygen atmospheres, insuring the absence of undesirable convective motions in-between these walls and a safety operation of the equipment. This then minimizes the possibility of sodium, oxygen, and cooling fluids' leaks and interactions. The high temperature zirconia insulation 11 and 12 provides for minimal heat losses from the furnace to the environment. The cooling fluid jacket 13 is employed to absorb the heat from the radiation heat sink zone 7 and provide for the control of the thermal gradient in the crystal growing region 2.

Figure 2:
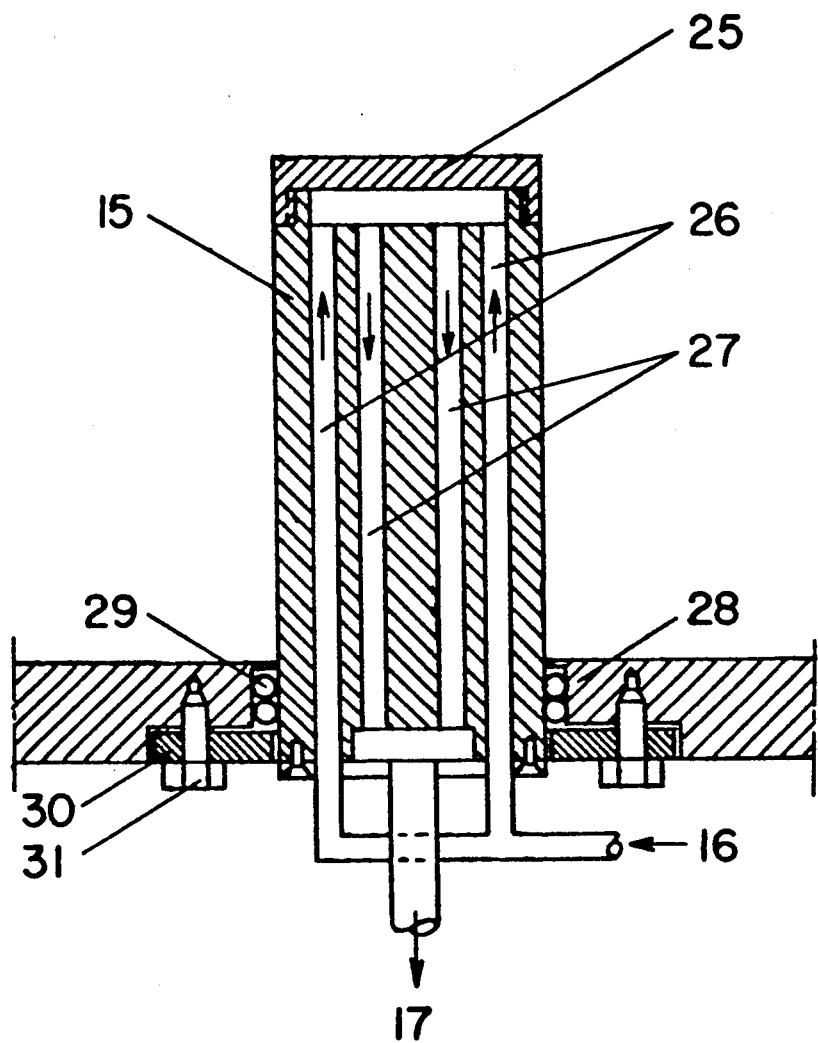
FIG. 2 shows the crucible base detail of FIG. 1.

The temperature gradient in the melt and crystal in crucible 14 and extraction of the latent heat of solidification is also controlled by cooling of the crucible base 15. The crucible base cooling is indicated in FIGS. 1 and 2 by lines 16 and 17, whereas the condenser and radiation heat sink zone cooling is indicated by lines 18 and 19. The fluid coolant lines are equipped with flow control valves 20 and the cooling fluid may be water. The vacuum in region 10 between the heat pipe and crystal growing environment is maintained by a vacuum pump 21, which is also used to evacuate the crystal growing region 2 before charging with oxygen from the oxygen reservoir 22 through the pressure regulator 23. The furnace design should employ the oxygen pressures from 0.1-1 MPa for growing different types of ceramic superconductors. The flow control valves 24 are used for isolating different parts of the furnace and control the vacuum conditions in the apparatus.

The furnace walls 28 and heat pipe walls should be constructed from inconel. The heat pipe can employ wick or groove structures in the evaporator region 5. The grooves can be cut into the axial and radial directions of the heat pipe walls on both sides of the evaporator (heater and crystal growing sides). It is clear that this furnace design, with crystal growing in the evaporator cavity of the heat pipe, can also be used for manufacturing other types of crystals, such as gallium arsenide if the oxygen atmosphere is replaced with an argon atmosphere and an encapsulated (boric oxide) is used on top of the crucible melt to prevent the loss of arsenic. In this situation the heat pipe should also employ a non-condensable gas with pressure regulation to achieve the optimum GaAs crystal growth conditions.

The crucible base 15 may be designed as shown in FIG. 1. Its top 25 consists of a high thermal conductivity material such as copper which is cooled from below by a fluid which enters through the cooling passages 26 and exits through the passages 27. The leak-free condition between the crucible base and furnace wall 28 can be maintained by the high temperature seals such as O-rings 29 which are pressed tightly between the walls of the plate 30 which is held secured to the furnace wall 28 by the screws 31. The furnace can be manufactured in parts and, after assembled with insulation, heat pipe, and heating coils, it can be joined together by weldings 32 and 33. Welding insures the elimination of leaks and a great deal of safety in the event of the system malfunction. The furnace should also be equipped with a computer control which senses the pressure from the pressure transducer 8, temperatures from the cavity wall 34, and temperature from the crucible base 25. The proper control of the process temperature in region 2 is then accomplished by controlling the heater power to coils 4 and flow rates through the cooling jackets 9 and 13 and crucible base 15. The crucible base may also employ a relative motion control with respect to the furnace cavity. Such a control system can move the crucible base vertically and rotate it for the purpose of more accurately controlling the thermal gradient in the melt in crucible 14.

I claim:

1. An apparatus for growing single crystals, the apparatus comprising a heat pipe with its evaporator forming an internal vertical cavity with an opening at its lower end; a rotating and vertically moving crucible base with provision for cooling on which a crucible with melt to be crystallized is placed and inserted into the said cavity of the heat pipe; a protecting wall between the crucible with melt and the said heat pipe cavity to prevent possible reactions between different heat pipe working fluids, gases in the crystal growing region and cooling fluids of the furnace; and a radiation heat sink zone below the open end of the heat pipe cavity.

2. The apparatus for growing crystals according to claim 1 wherein the temperature gradient in the cavity of the heat pipe evaporator and in the melt in crucible placed in the cavity is maintained by heating the evaporator with electrical heating coils and cooling of the radiation heat sink zone of the said cavity with a fluid; cooling of the condenser section of the said heat pipe with a fluid; supplying the inside of heat pipe evaporator with grooves and channels for efficient fluid transport in the heat pipe; and employing a gas in the said heat pipe to form a variable conductance heat pipe.

* * * * *